United States Patent
Wang

(10) Patent No.: US 10,155,413 B2
(45) Date of Patent: Dec. 18, 2018

(54) ROLLER STRUCTURE AND METHOD OF USING THE SAME

(71) Applicant: DTECH PRECISION INDUSTRIES CO., LTD., New Taipei (TW)

(72) Inventor: Ting-Jui Wang, New Taipei (TW)

(73) Assignee: DTECH PRECISION INDUSTRIES CO., LTD. (TW)

( * ) Notice: Subject to any disclaimer, the term of this patent is extended or adjusted under 35 U.S.C. 154(b) by 1 day.

(21) Appl. No.: 14/944,366

(22) Filed: Nov. 18, 2015

(65) Prior Publication Data

US 2016/0152073 A1 Jun. 2, 2016

(30) Foreign Application Priority Data

Nov. 28, 2014 (TW) .............................. 103141361 A

(51) Int. Cl.
*B60B 33/00* (2006.01)
*H05K 1/18* (2006.01)
*H05K 3/30* (2006.01)
*H05K 3/34* (2006.01)

(52) U.S. Cl.
CPC .......... *B60B 33/0002* (2013.01); *B60B 33/00* (2013.01); *H05K 1/182* (2013.01); *H05K 3/301* (2013.01); *H05K 3/34* (2013.01); *H05K 2201/2072* (2013.01); *H05K 2203/0143* (2013.01)

(58) Field of Classification Search
CPC ............................. B60B 33/0002; B60B 33/00
USPC ...... 193/35 R, 37, 35 MD; 198/370.09, 779; 384/50, 58, 51; 16/43, 102, 89, 91
See application file for complete search history.

(56) References Cited

U.S. PATENT DOCUMENTS

| | | | | |
|---|---|---|---|---|
| 581,216 | A * | 4/1897 | Merl ................... | B60B 33/0002 16/21 |
| 1,842,396 | A * | 1/1932 | Fitch .................... | B65G 63/004 193/35 R |
| 2,931,477 | A * | 4/1960 | Metzgar ................ | F16C 29/046 193/35 MD |
| 3,171,697 | A * | 3/1965 | Nicolaides ............ | F16C 13/006 384/19 |
| 3,508,293 | A * | 4/1970 | Bosco ..................... | B60B 33/00 16/21 |
| 3,614,804 | A * | 10/1971 | Grellsson ................ | A47L 9/009 16/21 |
| 3,722,968 | A * | 3/1973 | Bomberger ........... | F16C 13/006 384/492 |

(Continued)

*Primary Examiner* — William R Harp
(74) *Attorney, Agent, or Firm* — Schmeiser, Olsen & Watts, LLP

(57) ABSTRACT

A roller structure and method of using the same are introduced. The roller structure includes a first sleeve having a mounting portion for mounting a roller portion and a first connection portion for mounting a carried object, wherein the roller portion is disposed at the mounting portion; and a positioning element disposed at the first sleeve and the roller portion to cause the roller portion to rotate relative to the mounting portion. The roller structure can be conveniently and quickly amounted on the carried object, roller frame or circuit board such that roller structure gets standardized and modularized to serve an industrial purpose and provides rollers rotatable in all directions and suitable for use in SMT (Surface Mount Technology) processes and automated assembly operation.

6 Claims, 10 Drawing Sheets

(56) References Cited

U.S. PATENT DOCUMENTS

| | | | | |
|---|---|---|---|---|
| 4,295,688 | A * | 10/1981 | Blasnik | F16C 13/006 384/19 |
| 5,097,565 | A * | 3/1992 | Shorey | B60B 33/0002 16/20 |
| 5,302,030 | A * | 4/1994 | Buie | A47B 88/437 312/334.19 |
| 5,379,485 | A * | 1/1995 | Oshins | B60B 33/08 16/24 |
| 6,148,990 | A * | 11/2000 | Lapeyre | B65G 17/08 198/779 |
| 6,223,388 | B1 * | 5/2001 | Sey | B60B 33/0002 16/20 |
| 6,244,417 | B1 * | 6/2001 | Timmer | B60B 33/0002 193/35 MD |
| 6,494,312 | B2 * | 12/2002 | Costanzo | B65G 17/08 198/779 |
| 7,364,038 | B2 * | 4/2008 | Damkjaer | B65G 17/32 198/845 |
| 8,424,675 | B2 * | 4/2013 | Rau | B65G 17/24 198/779 |
| 8,783,449 | B2 * | 7/2014 | Murakami | B65G 17/40 198/779 |
| 2007/0089970 | A1 * | 4/2007 | Damkjaer | B65G 17/32 198/853 |
| 2016/0138647 | A1 * | 5/2016 | Wang | F16C 13/022 492/16 |

* cited by examiner

ROLLER STRUCTURE AND METHOD OF USING THE SAME

CROSS-REFERENCE TO RELATED APPLICATION

This non-provisional application claims priority under 35 U.S.C. § 119(a) on Patent Application No(s). 103141361 filed in Taiwan, R.O.C. on Nov. 28, 2014, the entire contents of which are hereby incorporated by reference.

FIELD OF TECHNOLOGY

The present invention relates to roller structures and methods of using the same and, more particularly, to a roller structure and method of using the same, characterized in that the roller structure is mounted in a movable carried object and circuit board in a manner to allow the carried object and circuit board or any other related object to move by means of rollers.

BACKGROUND

A conventional movable object is exemplified by a sliding door of a chassis or cabinet, a drawer, a movable panel or a special circuit board. To reduce the friction between the movable components and a rail or another object, it is necessary to mount multiple rollers on the movable objects each; hence, the movable components can move smoothly along the rail or relative to the other object.

However, there is still room for improvement in conventional roller structures and conventional methods of manufacturing the same. For example, assembly-oriented structures dedicated to the conventional rollers and disposed on movable objects are usually intricate in terms of structure and their assembly procedure is difficult to carry out; as a result, the related assembly process or steps are so complicated as to compromise the production efficiency. Also, the conventional roller structures are seldom suitable for forming modularized parts and components together with the other components, such as a shaft, and in consequence manufacturers have to cope with the processing process, the manufacturing process, and the assembly process on their own; as a result, modularized finished products of roller structures cannot be quickly mounted on the movable objects. Furthermore, the conventional roller structures are unfit for use with SMT (Surface Mount Technology) and thus unlikely to be applicable to any automated assembly process in the course of any automated production process.

Accordingly, it is imperative to provide a roller structure and a method of using the same which are conducive to improvement of the prior art.

SUMMARY

It is an objective of the present invention to provide a roller structure applicable to movable objects, such as carried objects, so as to not only allow rollers to undergo modularized assembly and production but also achieve structural streamlining and cost cutting.

Another objective of the present invention is to provide a method of using the aforesaid roller structure such that rollers are fit for use with SMT (Surface Mount Technology) to thereby enhance assembly efficiency and cut assembly costs.

In order to achieve the above and other objectives, the present invention provides a roller structure which comprises: a first sleeve having a mounting portion for mounting a roller portion and a first connection portion for mounting a carried object, wherein the roller portion is disposed at the mounting portion of the first sleeve; and a positioning element disposed at the first sleeve and the roller portion to cause the roller portion to rotate.

In an embodiment of the present invention, the mounting portion is concavely formed at an end of the first sleeve or penetrates a receiving space of the first sleeve.

In an embodiment of the present invention, the first sleeve has one or more pivotal connection portions in communication with the mounting portion, and the positioning element is coupled to the pivotal connection portion.

In an embodiment of the present invention, the pivotal connection portion is a pivotal hole or pivotal slot in communication with the receiving space, and the positioning element is coupled to the pivotal hole or pivotal slot.

In an embodiment of the present invention, the first connection portion is formed at one of an end, a middle, a surface and a point of the sleeve.

In an embodiment of the present invention, the positioning element is a bar penetratingly disposed or integrally formed at at least one of two ends of the roller portion.

In an embodiment of the present invention, the positioning element is penetratingly disposed at, riveted to, engaged with, latched to, snap-engaged with, adhered to or welded to the first sleeve.

In an embodiment of the present invention, the positioning element rotates freely relative to the first sleeve.

In an embodiment of the present invention, the roller portion rotates freely relative to the positioning element.

In an embodiment of the present invention, the roller portion is a cylinder or a sphere made of a single material or a composite material, such as metal, plastic or rubber, and the roller portion has a rolling surface which is glossy or thread.

In an embodiment of the present invention, a second sleeve is provided. The second sleeve has a disposing space and a second connection portion. The first sleeve is movably disposed in the disposing space of the second sleeve. The roller portion rotates relative to the first sleeve.

In an embodiment of the present invention, the first connection portion of the first sleeve or the second connection portion of the second sleeve is coupled to the carried object or a roller frame by riveting, expansion, welding, engagement, latching, or a means of magnetic attraction.

In an embodiment of the present invention, the first connection portion of the first sleeve or the second connection portion of the second sleeve has a groove filled with a material of the carried object or the roller frame.

In an embodiment of the present invention, the first connection portion of the first sleeve or the second connection portion of the second sleeve expands and joins a hole of the carried object or the roller frame by a die.

In an embodiment of the present invention, the first connection portion of the first sleeve or the second connection portion of the second sleeve is fixed to a circuit board. The circuit board has a hole corresponding in position to the first connection portion or second connection portion.

In an embodiment of the present invention, the first sleeve or the second sleeve is coupled to the roller frame to form a module, and the roller frame is coupled to the carried object.

In an embodiment of the present invention, a target object is disposed at the first sleeve or the second sleeve.

In an embodiment of the present invention, includes a loading element which has a first recess for containing the roller structure, or the loading element has first recesses and second recesses, wherein the second recesses are smaller than the first recesses, wherein the second recesses are located at a bottom of the first recesses, wherein the first sleeve or first sleeve and second sleeve of the roller structure is disposed at the first recesses of the loading element, and the roller portion of the roller structure is partially disposed at the second recesses of the loading element.

In an embodiment of the present invention, the first recess is covered with a holder whereby the roller structure is prevented from escaping.

In an embodiment of the present invention, the loading element is provided in the form of a band or a disk.

In order to achieve the above and other objectives, a method for applying the roller structure of the present invention preferably comprises the steps of: capturing the roller structure with a capturing device, mounting the first connection portion of the first sleeve or the second connection portion of the second sleeve on a circuit board (PCB), wherein a solder paste is disposed on the circuit board in advance, attaching the first connection portion of the first sleeve to the solder paste, and heating up the solder paste such that the solder paste is soldered to the first connection portion or the second connection portion.

The method is characterized in that the circuit board has an assembly-oriented hole, and the solder paste is disposed on a surface at a rim of the assembly-oriented hole of the circuit board, such that the first connection portion of the first sleeve or the second connection portion of the second sleeve is attached to the solder paste.

In an embodiment of the method for use with the roller structure of the present invention, a target object is disposed at the first sleeve or the second sleeve.

The method is characterized in that a loading element is provided, and the loading element has a first recess which the roller structure is disposed in, and the capturing device captures the roller structure from the loading element, or a loading element has first recesses and second recesses, wherein the second recesses are smaller than the first recesses, and the second recesses are located at a bottom of the first recesses, wherein the first sleeve, or first sleeve and second sleeve, of the roller structure is disposed at the first recesses of the loading element, and the roller portion of the roller structure is partially disposed at the second recesses of the loading element, wherein the capturing device captures the roller structure from the loading element.

The method is characterized in that the first recess is covered with a holder whereby the roller structure is prevented from escaping.

Regarding the method for use with the roller structure according to an embodiment of the present invention, the loading element is provided in the form of a band or a disk.

Hence, according to the present invention, the roller structure and method of using the same achieve advantages as follows:

1. The roller structure comprises a first sleeve whereby the roller structure can be conveniently and quickly mounted on a carried object, a roller frame or a circuit board.
2. The roller structure comprises standardized and modularized components so as to be applicable to electronic industry.
3. The roller structure comprises the first sleeve and a second sleeve which operate in conjunction with each other, such that the roller is capable of rotating in any direction.
4. Standardization and the modularization of the rollers is applicable to any SMT (surface mount technology) process and any automated assembly operation.

BRIEF DESCRIPTION

Objectives, features, and advantages of the present invention are hereunder illustrated with specific embodiments in conjunction with the accompanying drawings, in which.

DETAILED DESCRIPTION

Figure 1:
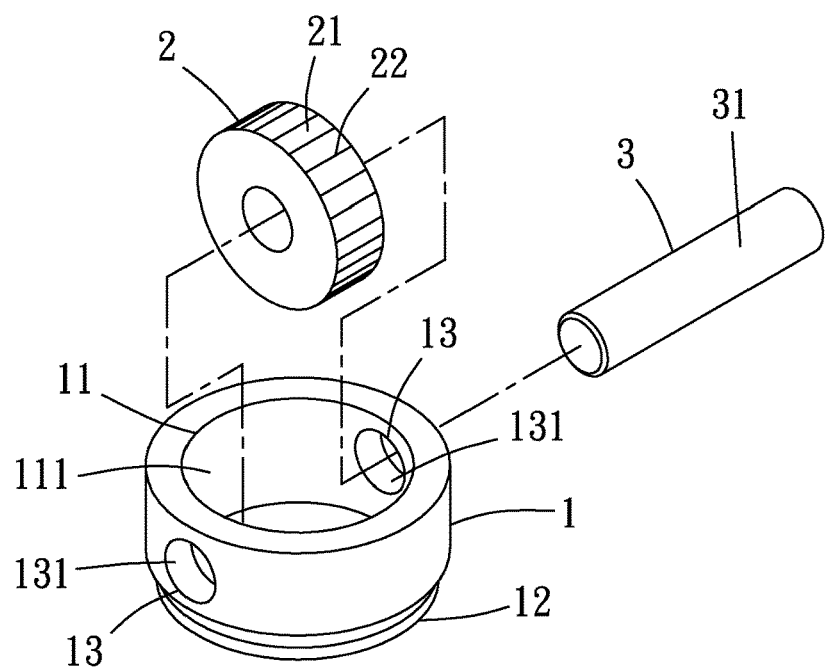
FIG. 1 is an exploded view of a roller structure according to the first preferred embodiment of the present invention.
Figure 2:
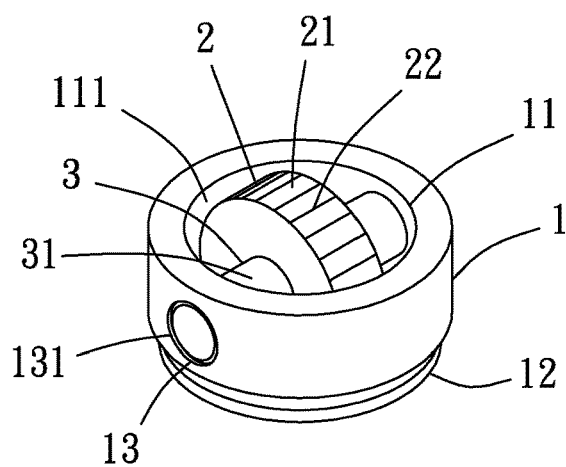
FIG. 2 is a perspective view of the roller structure according to the first preferred embodiment of the present invention.
Figure 3:
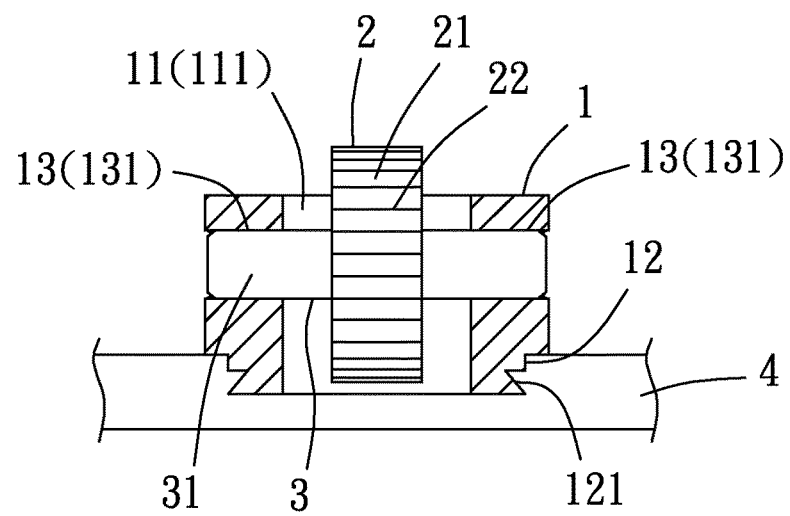
FIG. 3 is a cross-sectional view of the roller structure according to the first preferred embodiment of the present invention.

Referring to FIG. 1, FIG. 2 and FIG. 3, the present invention provides a roller structure which is applicable to electronic industry or any related industry. The roller structure, in a preferred embodiment, comprises a first sleeve 1, a roller portion 2 and a positioning element 3. The first sleeve 1 is round, elliptical, polygonal or of any other shape, and preferably hollow-cored cylindrical as shown in the diagrams. The first sleeve 1 comprises a mounting portion 11 for mounting a roller portion and a first connection portion 12 for mounting a carried object 4, and the carried object 4 is a circuit board. The roller portion 2 is capable of rotation whereby the carried object 4 moves by means of the roller portion 2 or moves relative to the roller portion 2. The mounting portion 11 disposed at the first sleeve 1 causes the roller portion 2 to rotate relative to the first sleeve 1. The positioning element 3 passes through the centers of the roller portion 2 and the first sleeve 1, such that the roller portion 2 can rotate about the mounting portion 11 of the first sleeve 1, so as to form the roller structure of the present invention.

Figure 4:
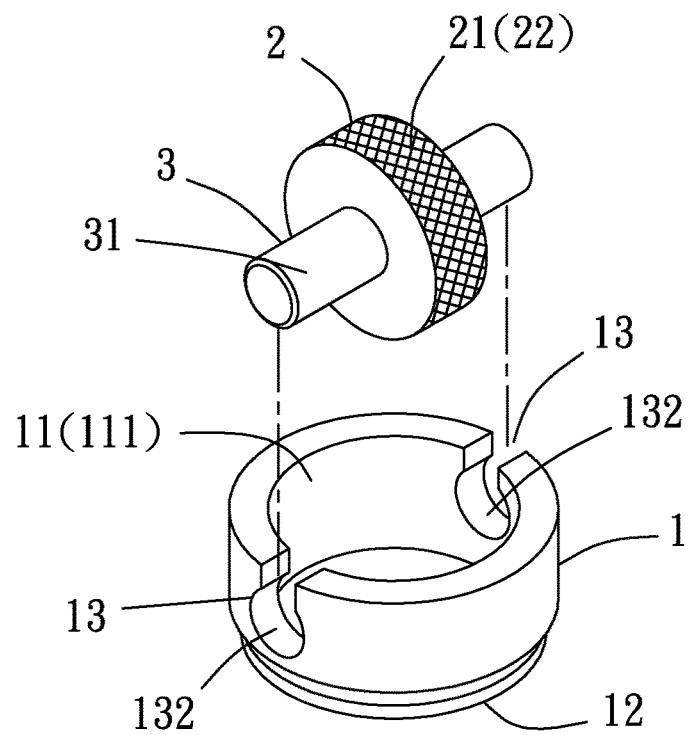
FIG. 4 is an exploded view of a pivotal slot of a pivotal connection portion according to a preferred embodiment of the present invention.
Figure 5:
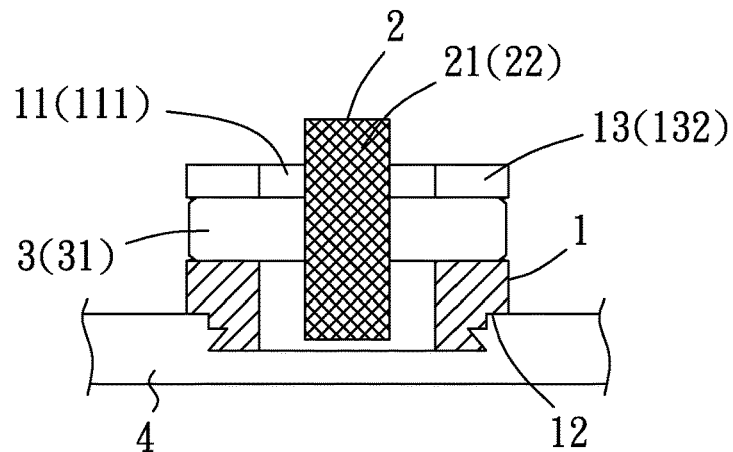
FIG. 5 is a cross-sectional view of the pivotal slot of the pivotal connection portion according to a preferred embodiment of the present invention.
Figure 7:
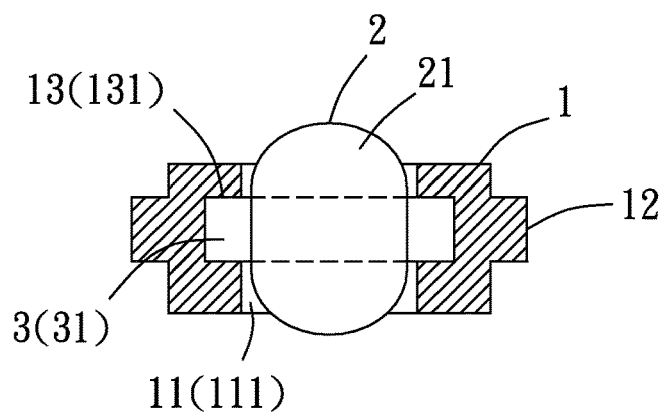
FIG. 7 is a cross-sectional view of the spherical roller portion according to a preferred embodiment of the present invention.

Referring to FIG. 1, FIG. 2 and FIG. 3, in an embodiment of the present invention, the mounting portion 11 of the first sleeve 1 is a receiving space 111 concavely formed at one end of the first sleeve 1 or penetrating the first sleeve 1. The receiving space 111 is a hole or slot which is round, elliptical, polygonal or of any shape, such that the roller portion 2 can be received in the receiving space 111. According to the present invention, the first sleeve 1 preferably has one or more pivotal connection portions 13 in communication with the mounting portion 11 (receiving space 111), such that the positioning element 3 is coupled to the pivotal connection portion 13. The pivotal connection portion 13 is a pivotal hole 131 (as shown in FIG. 1 and FIG. 3), a pivotal slot 132 (as shown in FIG. 4 and FIG. 5) or any other equivalent structure. The pivotal hole 131 or the pivotal slot 132 is in vertical communication with the receiving space 111. One or two ends of the positioning element 3 are coupled to the pivotal hole 131 or pivotal slot 132, such that the roller portion 2 can be disposed in the receiving space 111. The first connection portion 12 of the first sleeve 1 can be formed at any end, the middle (as shown in FIG. 7), any surface, or any point of the first sleeve 1, provided that it is coupled to a carried object 4. Due to the first connection portion 12, the first sleeve 1 can be coupled to the carried object 4 by riveting, expansion, welding, engagement, latching, or a means of magnetic attraction.

Figure 6:
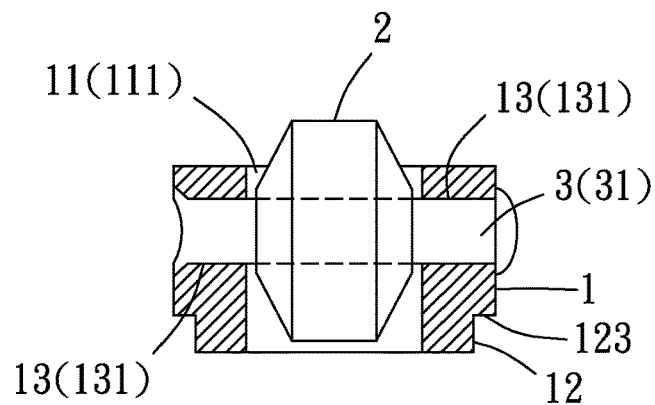
FIG. 6 is a cross-sectional view of the conical roller portion according to a preferred embodiment of the present invention.

Referring to FIG. 1, FIG. 2 and FIG. 3, according to the present invention, the positioning element 3 is preferably a bar 31, pipe, pin, screw, or any equivalent member, which is penetratingly disposed at or integrally formed at one or two ends of the roller portion 2, such that the positioning element 3 is movably penetratingly disposed at, riveted to (as shown in FIG. 6), engaged with, latched to, snap-engaged with, adhered to or welded to the pivotal hole 131 or pivotal slot 132 of the first sleeve 1. Therefore, the positioning element 3 disposed at the pivotal hole 131 or pivotal slot 132 of the first sleeve 1 can rotate freely, such that the roller portion 2 can also rotate. In a variant embodiment of the present invention, the roller portion 2 can rotate freely relative to the positioning element 3.

Figure 8:
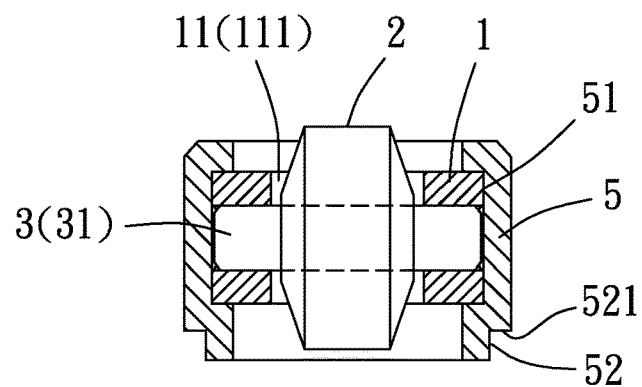
FIG. 8 is a cross-sectional view of a second sleeve according to a preferred embodiment of the present invention.

Referring to FIG. 1 through FIG. 5, according to the present invention, the roller portion 2 is a cylinder made of a single material or a composite material, such as metal, plastic or rubber. Referring to FIG. 6 and FIG. 8, the roller portion 2 is conical or bobbin-like and made of a single material or a composite material, such as metal, plastic or rubber. Referring to FIG. 7, the roller portion 2 is spherical or of any shape and made of a single material or a composite material, such as metal, plastic or rubber. The roller portion 2 has a rolling surface 21. The rolling surface 21 is glossy or has a concaved or convex thread 22. The thread 22 either runs longitudinally, transversely or obliquely or crosses each other.

Figure 9:
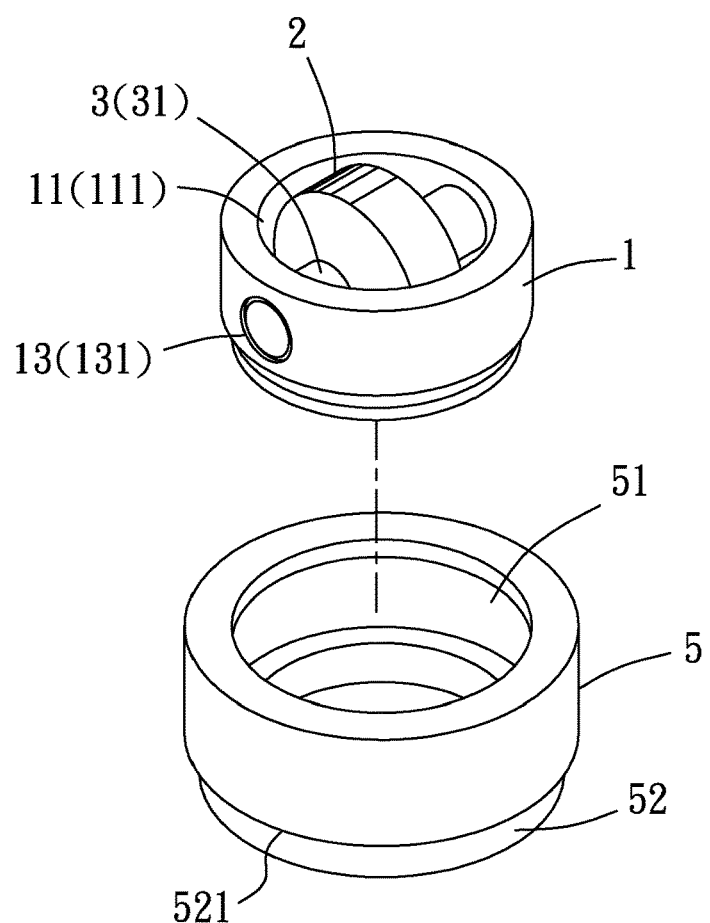
FIG. 9 is an exploded view of the second sleeve according to a preferred embodiment of the present invention.

Referring to FIG. 8 and FIG. 9, in a preferred embodiment of the present invention, a second sleeve 5 is provided. The second sleeve 5 is round, elliptical, polygonal or of any other shape, and is preferably hollow-cored as shown in the diagrams. The second sleeve 5 has a disposing space 51 and a second connection portion 52 whereby the second sleeve 5 can be coupled to a carried object 4. The carried object 4 is a circuit board. The second connection portion 52 is disposed at any end, the middle, any surface or any point of the second sleeve 5; hence, the first sleeve 1 is movably disposed in the disposing space 51 of the second sleeve 5 and yet dispensed with the first connection portion 12, such that the first sleeve 1 can rotate or move freely relative to the second sleeve 5, whereas the roller portion 2 can rotate relative to the first sleeve 1, thereby providing a roller structure capable of rotating in any direction.

Figure 10:
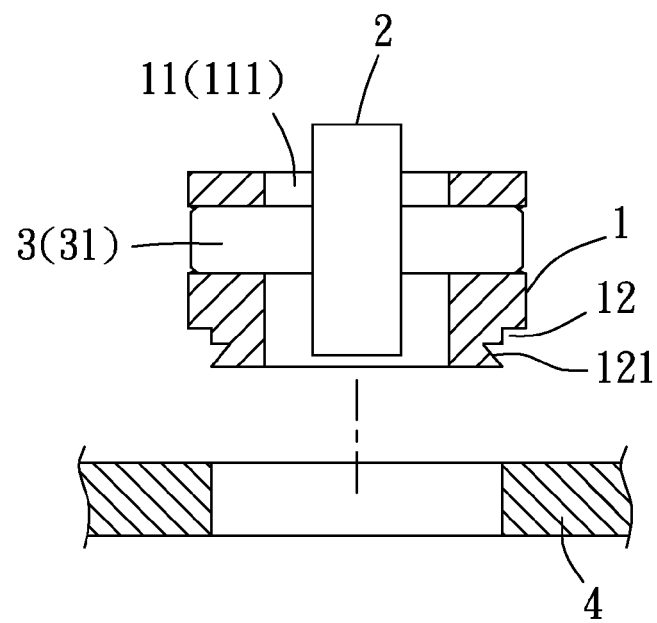
FIG. 10 is a schematic view which shows how to rivet with the roller structure according to a preferred embodiment of the present invention.
Figure 11:
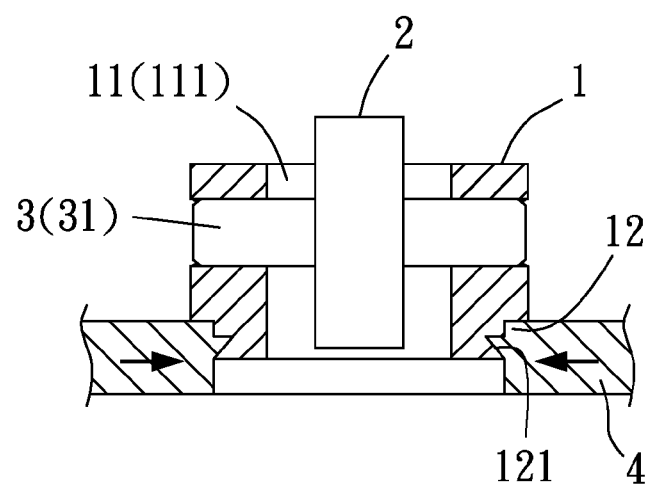
FIG. 11 is a schematic view which shows how to rivet with the roller structure according to a preferred embodiment of the present invention.
Figure 12:
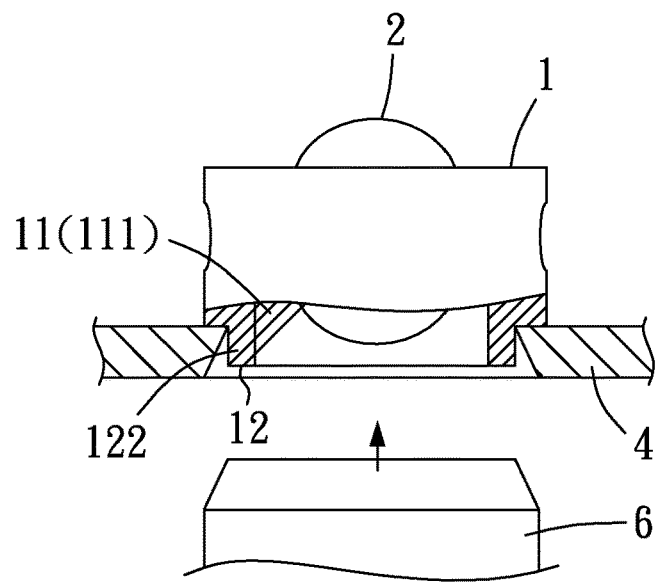
FIG. 12 is a schematic view which shows how to expand with the roller structure according to a preferred embodiment of the present invention.
Figure 13:
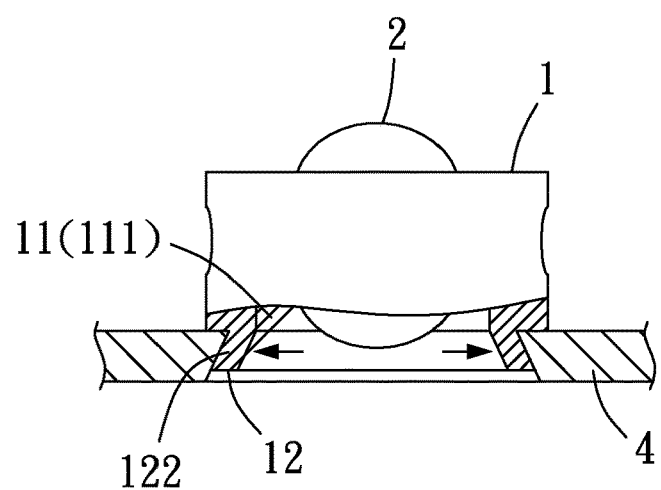
FIG. 13 is another schematic view which shows how to expand with the roller structure according to a preferred embodiment of the present invention.
Figure 18:
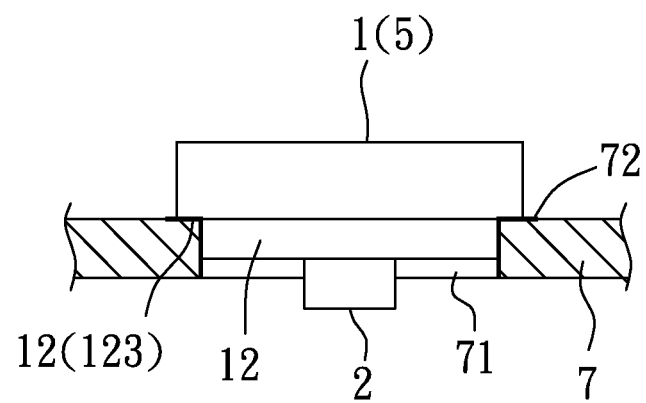
FIG. 18 is a schematic view which shows how to solder with the roller structure according to a preferred embodiment of the present invention.
Figure 19:
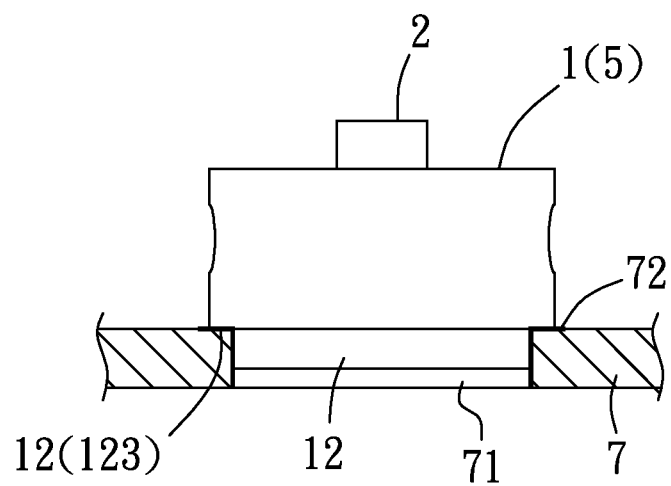
FIG. 19 is another schematic view which shows how to solder with the roller structure according to a preferred embodiment of the present invention.
Figure 20:
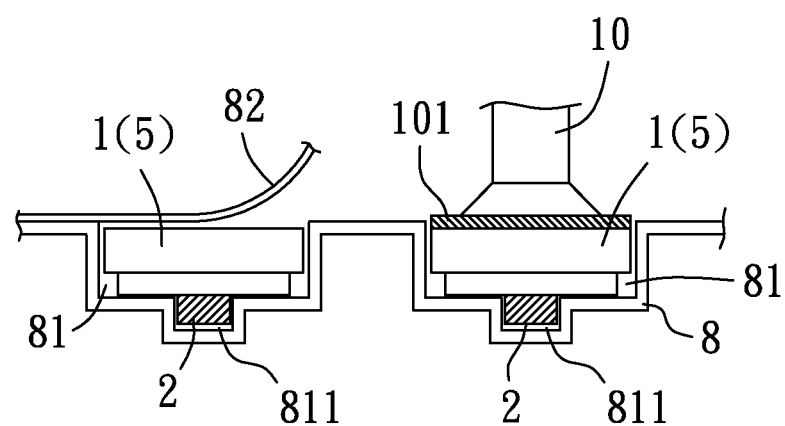
FIG. 20 is another schematic view of the automatic capturing operation of the method of using the roller structure according to a preferred embodiment of the present invention.

According to the present invention, both the first connection portion 12 of the first sleeve 1 and the second connection portion 52 of the second sleeve 5 can be coupled to a carried object 4. Specifically speaking, the first connection portion 12 or the second connection portion 52 is coupled to the carried object 4 by riveting, expansion, welding, engagement, latching, or a means of magnetic attraction. Referring to FIG. 10 and FIG. 11, a groove 121 is disposed at the periphery of the first connection portion 12 of the first sleeve 1 (likewise, referring to FIG. 8 and FIG. 9, the second connection portion 52 of the second sleeve 5 can also be a groove (not shown)), so as to allow a user to align the groove 121 of the first connection portion 12 with the hole of the carried object 4 and then fill the groove 121 of the first connection portion 12 with the material of the carried object 4 by a squeezing process to thereby finalize the structure required to rivet the first sleeve 1 or the second sleeve 5 to the carried object 4. Referring to FIG. 12 and FIG. 13, the first connection portion 12 of the first sleeve 1 forms an expanding portion 122 (likewise, referring to FIG. 8 and FIG. 9, the second connection portion 52 of the second sleeve 5 can also be an expanding portion (not shown)), so as to allow the user to align the expanding portion 122 of the first connection portion 12 with the hole of the carried object 4 and then allow the expanding portion 122 to expand and join the hole of the carried object by a die 6 to thereby finalize the structure required for the first sleeve 1 or the second sleeve 5 to expand and join the carried object 4. Referring to FIG. 18 and FIG. 19, the first connection portion 12 of the first sleeve 1 has a shoulder portion 123. Referring to FIG. 8 and FIG. 9, the second connection portion 52 of the second sleeve 5 has a shoulder portion 521 too. Hence, the shoulder portion 123 of the first sleeve 1 or the shoulder portion 521 of the second sleeve 5 is fixed to a circuit board 7 by soldering. Moreover, the circuit board 7 has an assembly-oriented hole corresponding in position to the first connection portion 12 or second connection portion 52 to thereby form a soldering structure for use by the first sleeve 1 or the second sleeve 5.

Figure 14:
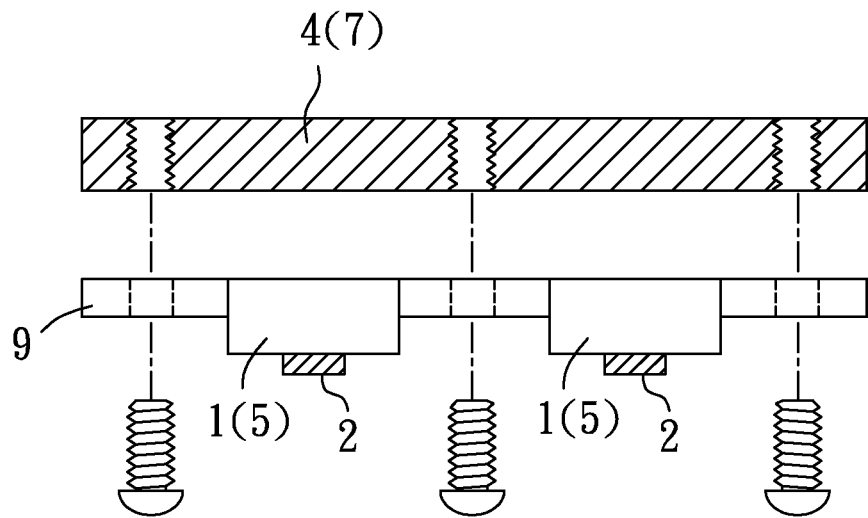
FIG. 14 is a schematic view of a roller coupled to a roller frame according to a preferred embodiment of the present invention.

Referring to FIG. 14, regarding the first sleeve 1 or the second sleeve 5 of the present invention, the aforesaid structures are coupled to a roller frame 9 to form a standardized module. For example, one or more rollers are coupled to a roller frame 9, such that the roller frame 6 is then coupled to the carried object 4 by riveting, expansion, welding, engagement, latching, or a means of magnetic attraction.

Figure 15:
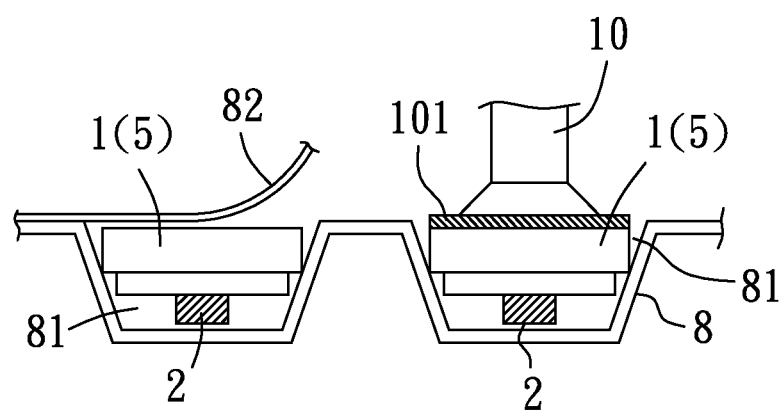
FIG. 15 is a schematic view of an automatic capturing operation of a method of using the roller structure according to a preferred embodiment of the present invention.
Figure 16:
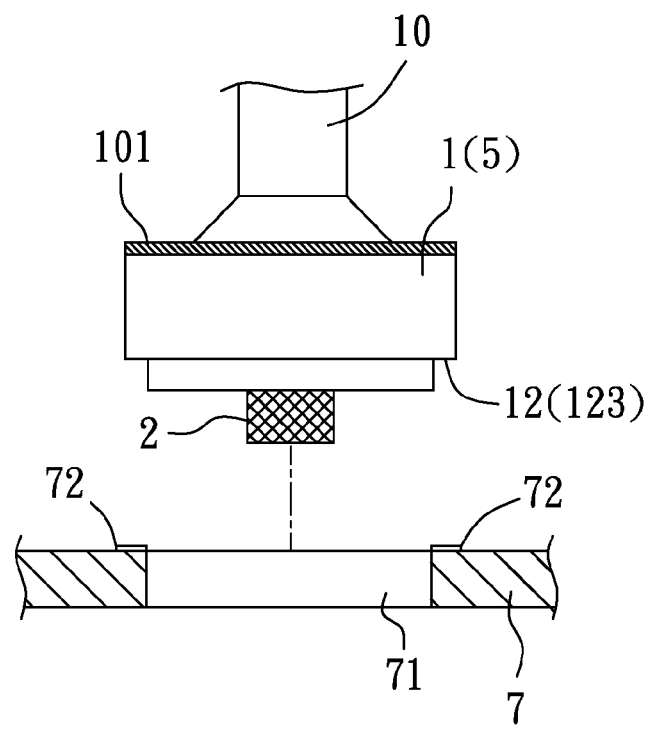
FIG. 16 is a schematic view of the first circuit board surface mount operation of the method of using the roller structure according to a preferred embodiment of the present invention.
Figure 17:
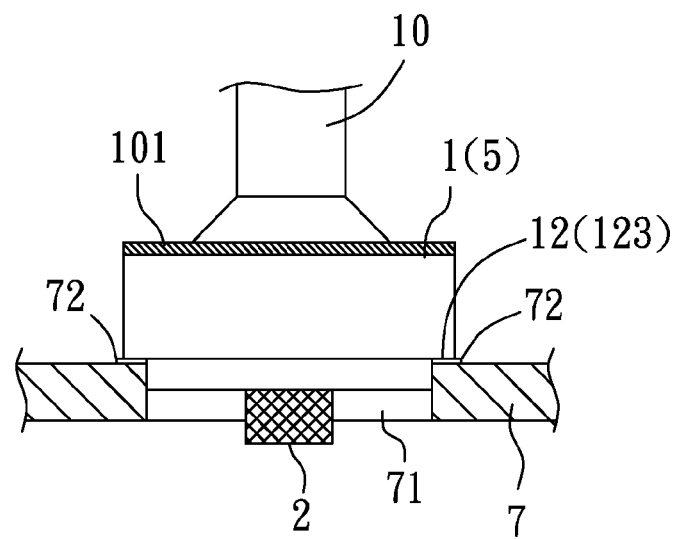
FIG. 17 is a schematic view of the second circuit board surface mount operation of the method of using the roller structure according to a preferred embodiment of the present invention.

Referring to FIG. 15, FIG. 16 and FIG. 17, the present invention further provides a method of applying a roller structure to SMT (Surface Mount Technology) and preferably capturing the first sleeve 1 or the second sleeve 5 of the roller structure of the present invention by a capturing device 10 (robot arm, suction cup or any other equivalent device) or by hand, mounting the first connection portion 12 of the first sleeve 1 (shoulder portion 123) to the surface of a circuit board 7 (PCB), or mounting the second connection portion 52 of the second sleeve 5 (shoulder portion 521) to the surface of a circuit board 7 (PCB), wherein a solder paste 72 is disposed on the surface of the circuit board 7 in advance, such that the first connection portion 12 of the first sleeve 1 (shoulder portion 123) is attached to the solder paste 72, or the second connection portion 52 of the second sleeve 5 (shoulder portion 521) is attached to the solder paste 72. Afterward, the solder paste 72 is heated up and gets soldered to the first connection portion 12 of the first sleeve 1 (shoulder portion 123) or gets soldered to the second connection portion 52 of the second sleeve 5 (shoulder portion 521), so as to quickly finalize the assembly structure required for applying the roller structure of the present invention to a circuit board (as shown in FIG. 18 and FIG. 19) and enhance the assembly application efficiency. The circuit board 7 preferably has an assembly-oriented hole 71. The solder paste 72 is disposed on a surface at the rim of the assembly-oriented hole 71 of the circuit board 7. Hence, the first connection portion 12 of the first sleeve 1 of the roller structure of the present invention is captured by the capturing device 10 and disposed at the assembly-oriented hole 71. Alternatively, the second connection portion 52 of the second sleeve 5 of the roller structure of the present invention is captured by the capturing device 10 and disposed at the assembly-oriented hole 71 or a plane outside the assembly-oriented hole 71. Hence, the shoulder portion 123 of the first connection portion 12 is attached to the solder paste 72, such that the shoulder portion 521 of the second connection portion 52 is attached to the solder paste 72, before undergoing the aforesaid heating and soldering process. Preferably, the heating process is carried out in a manner that the first sleeve 1 or second sleeve 5 mounted to the circuit board 7 are processed by a reflow oven so as to finish the soldering process of SMT.

To conveniently mount the roller structure of the present invention on the carried object 4 or the circuit board 7 by SMT (Surface Mount Technology), the roller structure of the present invention must enable the capturing device 10 to capture a target precisely. Referring to FIG. 15, in a preferred embodiment of the present invention, a loading element 8 is provided. The loading element 8 has one or more first recesses 81 which contain the roller structure of the present invention. The first recesses 81 are each covered with a holder 82 whereby the roller structure is prevented from escaping. The holder 82 is provided in the form of a film, for example. Hence, after the SMT-based capturing device 10 has captured a roller of the present invention, the roller is attached to the solder paste 72 disposed on the circuit board 7, as shown in FIG. 16 and FIG. 17. Furthermore, referring to FIG. 20, the loading element 8 has one or more first recesses 81 and second recesses 811. The second recesses 811 are smaller than the first recesses 81. The second recesses 811 are located at the bottom of the first recesses 81. The first sleeve 1, or the first sleeve 1 and second sleeve 5, of the roller structure are disposed at the first recesses 81 of the loading element 8. The roller portion 2 of the roller structure is partially disposed at the second recesses 811 of the loading element 8. Likewise, the first recesses 81 are covered with the holder 82 for preventing the roller structure from escaping. The holder 82 is a film which covers the first recesses 81. Referring to FIGS. 15-17 and 20, the roller structure comprises a target object 101 disposed at the first sleeve 1 or the second sleeve 5 by adhesion, engagement, latching or magnetic attraction. The target object 101 looks like a panel, a post, a buckle or a helix so as to be captured by the capturing device 10 (robot arm, suction cup or any other equivalent device).

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A roller structure, comprising:
   a carried object;
   a first sleeve having a mounting portion for mounting a roller portion and a first connection portion for mounting the carried object, wherein the roller portion is disposed at the mounting portion of the first sleeve; and
   a positioning element disposed at the first sleeve and the roller portion to cause the roller portion to rotate;
   wherein at least one of:
   a groove is disposed at a periphery of the first connection portion of the first sleeve, the groove of the first connection portion is aligned with a hole of the carried object and then the groove of the first connection portion is filled with a material of the carried object by a squeezing process; and
   a solder paste is disposed on the surface of the carried object, wherein the first connection portion of the first sleeve is attached to the solder paste and soldered to the carried object.

2. The roller structure of claim 1, wherein the mounting portion is concavely formed at an end of the first sleeve or penetrates a receiving space of the first sleeve.

3. The roller structure of claim 2, wherein the first sleeve has at least a pivotal connection portion in communication with the mounting portion, and the positioning element is coupled to the pivotal connection portion.

4. The roller structure of claim 3, wherein the pivotal connection portion is one of a pivotal hole and a pivotal slot in communication with the receiving space, and the positioning element is coupled to one of the pivotal hole and the pivotal slot.

5. The roller structure of claim 1, wherein the positioning element is a bar penetratingly disposed or integrally formed at at least one of two ends of the roller portion.

6. A roller structure, comprising:
   a carried object;

a first sleeve having a mounting portion for mounting a roller portion, wherein the roller portion is disposed at the mounting portion of the first sleeve;

a positioning element disposed at the first sleeve and the roller portion to cause the roller portion to rotate; and a second sleeve having a disposing space and a second connection portion, with the first sleeve movably disposed in the disposing space of the second sleeve and the roller portion rotatable relative to the first sleeve;

wherein at least one of:

- a groove is disposed at a periphery of the second connection portion of the second sleeve, the groove of the second connection portion is aligned with a hole of the carried object and then the groove of the second connection portion is filled with a material of the carried object by a squeezing process; and
- a solder paste is disposed on the surface of the carried object, wherein the second connection portion of the second sleeve is attached to the solder paste and soldered to the carried object.

* * * * *